United States Patent [19]
Marmonier

[11] Patent Number: 5,859,591
[45] Date of Patent: Jan. 12, 1999

[54] CONTROL DEVICE FOR HIGH-VOLTAGE EQUIPMENT INCLUDING A DISPLAY PANEL

[75] Inventor: Jean Marmonier, Aix Les Bains, France

[73] Assignee: GEC Alsthom T & D SA, Paris, France

[21] Appl. No.: 832,347

[22] Filed: Apr. 2, 1997

[30] Foreign Application Priority Data

Apr. 3, 1996 [FR] France .................................. 96 04191

[51] Int. Cl.⁶ ....................................................... G08B 5/00
[52] U.S. Cl. ................................. 340/815.4; 340/286.13; 340/635; 340/679; 340/691.6; 340/693.5
[58] Field of Search .............................. 340/286.13, 635, 340/679, 815.4, 286.14, 815.49, 815.56, 815.67, 691, 693

[56] References Cited

U.S. PATENT DOCUMENTS

| | | | |
|---|---|---|---|
| 3,582,927 | 6/1971 | Primavera | 340/815.49 |
| 4,176,941 | 12/1979 | Breitenkam et al. | 340/286.13 |
| 4,559,519 | 12/1985 | Matsumoto et al. | 340/286.13 |
| 4,949,035 | 8/1990 | Palmer, II | 340/687 |

FOREIGN PATENT DOCUMENTS 85194743  9/1985  Germany.

Primary Examiner—Daniel J. Wu
Attorney, Agent, or Firm—Sughrue, Mion, Zinn, Macpeak & Seas, PLLC

[57] ABSTRACT

A control device for high-voltage equipment includes a computer adapted to receive status information from the equipment via at least one transmission cable. A display system includes a support device carrying on its visible face an equipment status mimic diagram associated with indicator lamps and at least one connector connected directly to the transmission cable, incorporating the indicator lamps and removably connected to the computer at a connection face thereof. The support device and the connector are so disposed that the latter presents the indicator lamps in a manner associated with the mimic diagram of the support device whether it is connected to the computer in a normal position or disconnected from the computer in an emergency position.

6 Claims, 2 Drawing Sheets

CONTROL DEVICE FOR HIGH-VOLTAGE EQUIPMENT INCLUDING A DISPLAY PANEL

BACKGROUND OF THE INVENTION

1. Field of the invention

The present invention concerns a control device for high-voltage equipment including a display panel.

To be more precise, it concerns a control device for high-voltage equipment including:

a computer adapted to receive status information from the equipment via at least one transmission cable, and a display system including a support device carrying on its visible face an equipment status mimic diagram associated with indicator lamps.

2. Description of the Prior Art

There are three conventional modes of operation of control devices for high-voltage equipment:

from a centralized control room from which commands are sent to the computer, in a local operation mode from a local cabinet from which the control buttons of the display panel can be operated, the computer being operational and the computer and the display panel being accommodated in the cabinet, and in an emergency operation mode from a local cabinet, the computer not being operational.

The operating mode is typically selected by a three-position switch.

The digital computer assures the automatic control functions, for example interlocking in accordance with the status of other high-voltage equipment, the density of the dielectric gas in the various compartments in the case of metal-clad or other equipment, etc.

The computer replaces the electromechanical relay devices used previously and offers the possibility of evolution towards more sophisticated functions, for example surveillance of the status of the equipment and the possibility of communicating with a higher control and command level via a communication bus.

However, this technology is greeted with some reluctance by some operators because of the necessity to review maintenance methods and more importantly the fear that a major computer failure would render the system totally inoperable and operation impossible.

At present, the display panel function is implemented by two different types of systems:

by a display system that is totally independent of the computer, i.e. the control buttons and the indicator lamps of which are physically separate from the computer; the display system is then energized by a polarity independent of that of the computer and fed by a status information transmission cable from the equipment which is also independent of that of the computer; operation in the emergency mode from the independent display system is then no problem and this solution is therefore reliable although costly.

a display system entirely integrated into the computer, i.e. the control buttons and the indicator lamps of which are physically integrated into the computer; it is then fed directly by the computer but should the latter fail the display system is no longer operational; this solution is therefore relatively economical but it is not reliable for the operator since in the event of computer failure operation in the emergency mode is not possible.

The control device of the invention solves these problems, being less costly than the control devices including the first type of display system and more reliable than those incorporating the second type of display system. It offers an optimal reliability/cost trade-off.

SUMMARY OF THE INVENTION

To this end, in accordance with the invention, a control device for high-voltage equipment includes a computer adapted to receive status information from the equipment via at least one transmission cable, a display system including a support device carrying on its visible face an equipment status mimic diagram associated with indicator lamps and at least one connector connected directly to said transmission cable, incorporating said indicator lamps and removably connected to said computer at a connection face thereof, said support device and said connector being so disposed that the latter presents said indicator lamps in a manner associated with said mimic diagram of said support device whether it is connected to said computer in a normal position or disconnected from said computer in an emergency position.

In the preferred embodiment of the invention the support device is parallel to the connection face of the computer and fixed to the latter.

The support device advantageously includes means for holding the connector in the emergency position.

The support device is preferably a pivoting plate on the computer and the indicator lamps of the connector and the mimic diagram carried by said plate are associated by lodging the connector in orifices formed in the plate.

In a manner that is known in itself, the support device also carries local control buttons.

The invention is described in more detail hereinafter with reference to the accompanying drawings which show one preferred embodiment of the invention.

DETAILED DESCRIPTION OF THE PREFERRED EMBODIMENT

Figure 1:
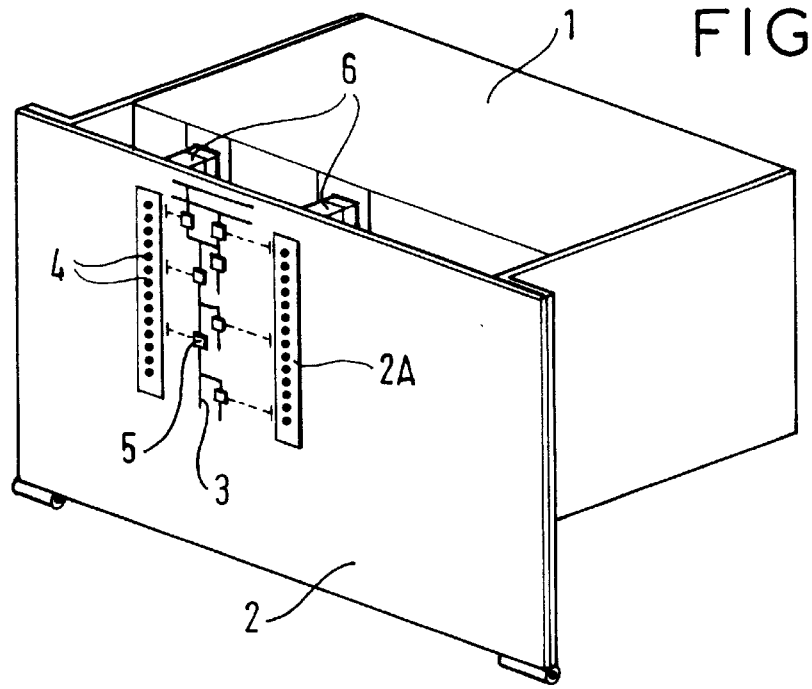
FIGS. 1 through 4 are perspective views of a control device in accordance with the invention.

The control device for high-voltage equipment includes:

a digital computer 1 adapted to receive status information from the equipment and to transmit programmed commands from a higher level, a display system including a support device comprising a plate 2 carrying on its visible face an equipment status mimic diagram 3 and local control buttons 5, and connectors 6 connected directly to a cable 7 transmitting status information from the equipment, including indicator lamps 4 adapted to be associated with the mimic diagram 3 and removably connected to the computer 1 on a connection face 1A of the latter. Connectors 6 of this kind are known in themselves and are used in programmable automatic controller installations.

The plate 2 and the connectors 6 are disposed so that the latter present the indicator lamps 4 in a manner associated with the mimic diagram 3 on the plate 2 whether they are connected to the computer 1 in the normal position or disconnected from the computer 1 in the emergency position.

FIGS. 1 through 4 show these two positions.

In FIG. 1, the device is in the normal position.

The connectors 6 are plugged into the computer 1. They receive status information from the equipment via the transmission cable 7 and transmit it to the computer 1. The plate 2 is held parallel to the connection face 1A by a mechanical coupling, described in more detail below, with two lateral walls 1B, 1C extending the connection face 1A of the casing of the computer 1. The association of the indicator lamps 4, the connectors 6 and the mimic diagram 3 carried by the plate 2 is effected by lodging the front panel of the connector 6 carrying the lamps 4 in orifices 2A in the plate 2.

The control device can therefore operate in a local operation mode, using the control buttons 5, the computer 1 being operational.

Figure 2:
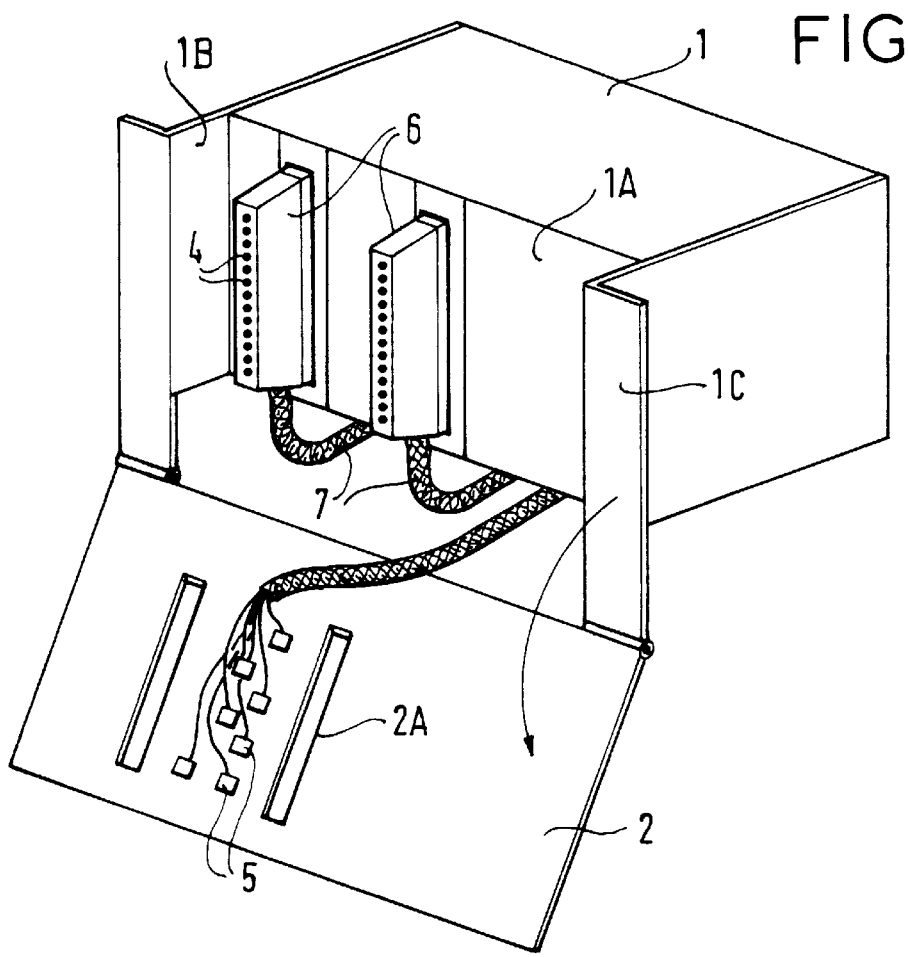

If the computer 1 is out of service, usually to enable it to be worked on if it is faulty, for example, initially the plate 2 is moved away from the connection face 1A of the computer 1, as shown in FIG. 2. To allow this, it advantageously pivots on the bottom horizontal edge of the lateral walls 1B, 1C by means of hinges. The control buttons 5 move with the plate 2.

Figure 3:
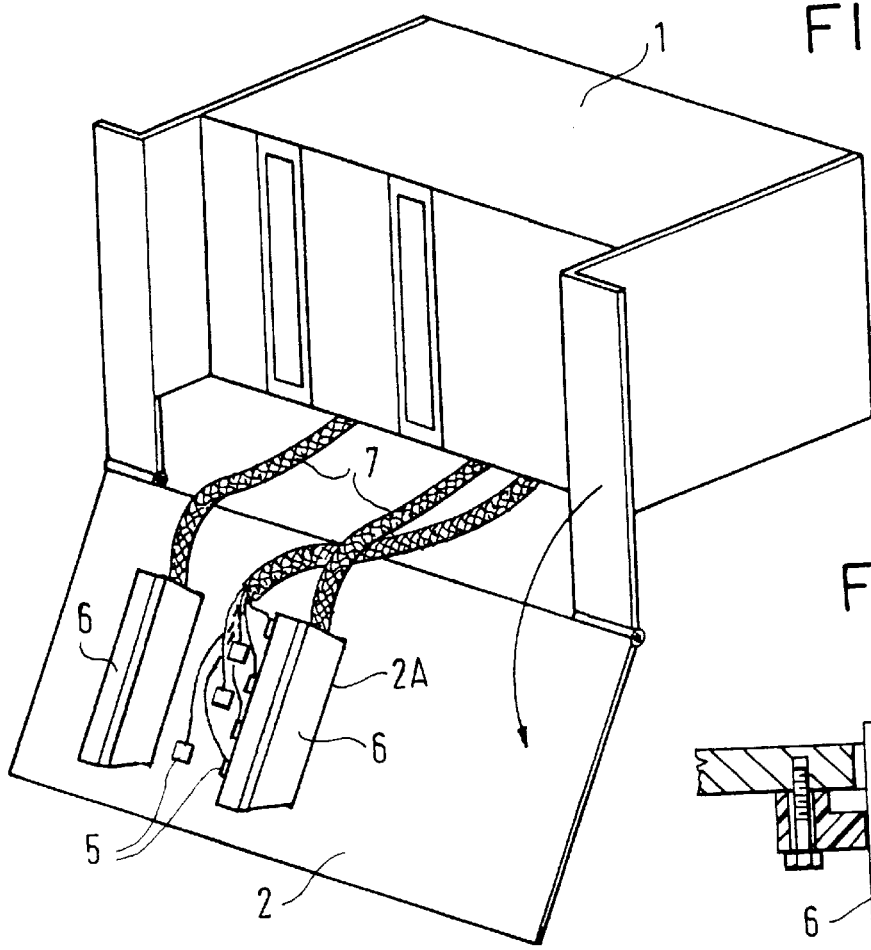

Then, the connectors 6 are disconnected from the computer 1 and fixed to the plate 2 as shown in FIG. 3. To allow this, the plate 2 includes connector holding means, one preferred embodiment of which is described below.

The computer 1 is then inoperative and it is possible to work on it, for example to remove a faulty circuit board for repair.

Figure 4:
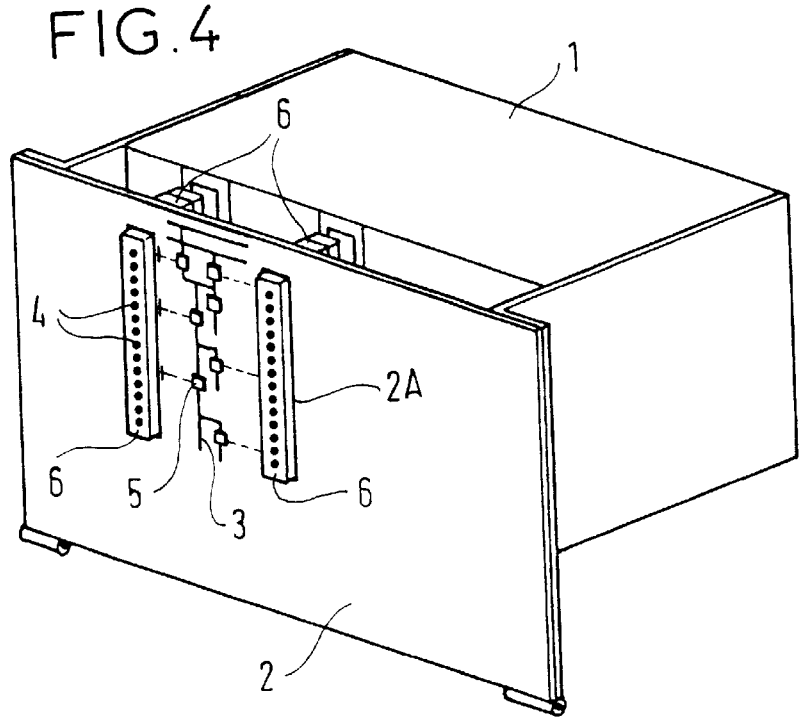

The plate 2 is then returned to its position against the lateral walls 1B, 1C by pivoting it and mechanically fixing it against the latter, for example by means of hooks or magnets, as shown in FIG. 4. Because of the holding means, the connectors 6 are slightly spaced from the connection face 1A.

The device is then in the emergency position, the equipment being monitored by means of the indicator lamps 4 associated with the mimic diagram 3 and local control being effected by means of the control buttons 5, the computer being inoperative.

Figure 5:
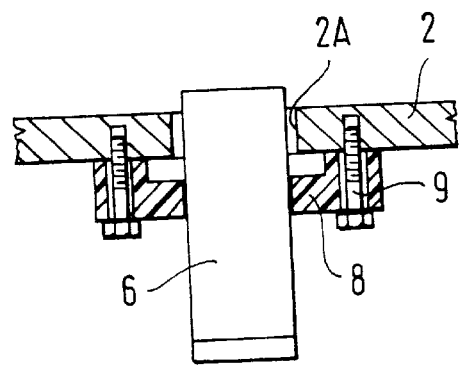
FIG. 5 is a part-sectional detail view.

One embodiment of the means for holding the connectors 6 to the plate 2 in the emergency position is shown in FIG. 5.

Members 8 of an elastic material such as rubber are fixed to the plate 2 by screws or rivets 9, on at least two sides of the orifices 2A, one only of which is shown here. These members 8 are spaced so that when the connector 6 has been introduced between them and into the orifice 2A, they apply a compression force to the walls of the connector 6 to hold it in place.

This compression force is insufficient to retain the connector 6 when it is plugged into the connection face 1A of the computer 1, as shown in FIG. 2, however.

There is claimed:

1. A control device for high-voltage equipment including a computer adapted to receive status information from the equipment via at least one transmission cable, a display system including a support device having a visible face that carries an equipment status mimic diagram associated with indicator lamps, and at least one connector connected directly to said transmission cable, said connector incorporating said indicator lamps and being removably connected to said computer at a connection face thereof, said support device and said connector being so disposed that said connector presents said indicator lamps in a manner associated with said mimic diagram of said support device when said connector is connected to said computer in a normal position and when said connector is disconnected from said computer in an emergency position.

2. The device claimed in claim 1 wherein said support device is parallel to said connection face of said computer and fixed to said computer.

3. The device claimed in claim 1 wherein said support device includes means for holding said connector in said emergency position.

4. The device claimed in claim 1 wherein said support device is a plate pivotally attached to said computer.

5. The device claimed in claim 4 wherein said indicator lamps of said connector and said mimic diagram carried by said plate are associated by lodging said connector in orifices in said plate.

6. The device claimed in claim 1 wherein said support device also carries local control buttons.

* * * * *